(12) United States Patent
Tel et al.

(10) Patent No.: US 12,124,179 B2
(45) Date of Patent: Oct. 22, 2024

(54) METHOD OF WAFER ALIGNMENT USING AT RESOLUTION METROLOGY ON PRODUCT FEATURES

(71) Applicant: ASML NETHERLANDS B.V., Veldhoven (NL)

(72) Inventors: Wim Tjibbo Tel, Veldhoven (NL); Hermanus Adrianus Dillen, Veldhoven (NL); Marc Jurian Kea, Morgan Hill, CA (US); Roy Werkman, Eindhoven (NL); Weitian Kou, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 31 days.

(21) Appl. No.: 17/920,014

(22) PCT Filed: May 11, 2021

(86) PCT No.: PCT/EP2021/062417
§ 371 (c)(1),
(2) Date: Oct. 19, 2022

(87) PCT Pub. No.: WO2021/228811
PCT Pub. Date: Nov. 18, 2021

(65) Prior Publication Data
US 2023/0168594 A1 Jun. 1, 2023

Related U.S. Application Data

(60) Provisional application No. 63/180,910, filed on Apr. 28, 2021.

(30) Foreign Application Priority Data

May 14, 2020 (EP) ..................................... 20174607
Nov. 17, 2020 (EP) ..................................... 20208071

(51) Int. Cl.
*G03F 9/00* (2006.01)

(52) U.S. Cl.
CPC .......... *G03F 9/7023* (2013.01); *G03F 9/7088* (2013.01)

(58) Field of Classification Search
CPC .... G03F 9/7003; G03F 9/7023; G03F 9/7053; G03F 9/7088
See application file for complete search history.

(56) References Cited

U.S. PATENT DOCUMENTS 5,621,813 A 4/1997 Brown et al.
6,952,253 B2 10/2005 Lof et al.
(Continued)

FOREIGN PATENT DOCUMENTS

JP 2007043152 2/2007
JP 2007049049 2/2007
(Continued)

OTHER PUBLICATIONS

Yahiro, T. et al., "Feed-forward alignment correction for advanced overlay process control using a standalone alignment station 'Litho Booster'," Proc. of SPIE, vol. 10585 (2018).
(Continued)

*Primary Examiner* — Peter B Kim
(74) *Attorney, Agent, or Firm* — Pillsbury Winthrop Shaw Pittman, LLP

(57) ABSTRACT

A method of determining a position of a product feature on a substrate, the method includes: obtaining a plurality of position measurements of one or more product features on a substrate, wherein the measurements are referenced to either a positioning system used in displacing the substrate in between measurements or a plane parallel to the surface of the substrate; and determining a distortion component of the substrate based on the position measurements.

20 Claims, 2 Drawing Sheets

(56) References Cited

U.S. PATENT DOCUMENTS

| | | | |
|---|---|---|---|
| 9,702,827 | B1 | 7/2017 | Brauer et al. |
| 10,324,379 | B2 | 6/2019 | Affentauschegg et al. |
| 10,495,990 | B2 | 12/2019 | Menger et al. |
| 2005/0007572 | A1 | 1/2005 | George et al. |
| 2005/0145805 | A1 | 7/2005 | Hoefnagels et al. |
| 2007/0026325 | A1 | 2/2007 | Derksen et al. |
| 2018/0364590 | A1* | 12/2018 | Van Der Schaar ........................ G03F 7/70625 |
| 2019/0324371 | A1 | 10/2019 | Van Der Logt et al. |

FOREIGN PATENT DOCUMENTS

| | | |
|---|---|---|
| JP | 2015099054 | 5/2015 |
| JP | 2018500600 | 1/2018 |
| JP | 2018523152 | 8/2018 |
| JP | 2020021076 | 2/2020 |
| TW | 200801860 | 1/2008 |
| WO | 2015/049087 | 4/2015 |

OTHER PUBLICATIONS

English translation of Office Action dated Mar. 9, 2022, issued in the corresponding Taiwanese Patent Application No. 110117586.
Office Action issued in corresponding Japanese Patent Application No. 2022-563011, dated Nov. 20, 2023.
Office Action issued in corresponding Japanese Patent Application No. 2022-563011, dated Apr. 30, 2024.

* cited by examiner ns application of PCT Patent
METHOD OF WAFER ALIGNMENT USING AT RESOLUTION METROLOGY ON PRODUCT FEATURES

CROSS-REFERENCE TO RELATED APPLICATIONS

This is a U.S. national stage application of PCT Patent Application No. of PCT/EP2021/062417, filed May 11, 2021, which application claims priority of European Patent Application No. 20174607.0 which was filed on 14 May 2020 and of European Patent Application No. 20208071.9 which was filed on 17 Nov. 2020 and of U.S. Patent Application No. 63/180,910 which was filed on 28 Apr. 2021 and which are each incorporated herein in its entirety by reference.

FIELD

The present invention relates to methods of determining a correction to a process, a semiconductor manufacturing processes, a lithographic apparatus, a lithographic cell and associated computer program products.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

International Patent Application WO 2015049087, which is incorporated by reference herein in its entirety, discloses a method of obtaining diagnostic information relating to an industrial process. Alignment data or other measurements are made at stages during the performance of the lithographic process to obtain object data representing positional deviation or other parameters measured at points spatially distributed across each wafer. Overlay and alignment residuals typically show patterns across the wafer, known as fingerprints.

In semiconductor manufacture, the Critical Dimension (CD) performance parameter fingerprint can be corrected using a simple control loop. Typically a feedback mechanism controls the average dose per wafer, using the scanner (a type of lithographic apparatus) as an actuator. Similarly, for the overlay performance parameter overlay, fingerprints induced by processing tools can be corrected by adjusting scanner actuators.

Sparse after-develop inspection (ADI) measurements are used as input for a global model used for controlling a scanner (typically run-to-run). Less-frequently measured dense ADI measurements are used for modelling per exposure. Modelling per exposure is performed for fields having large residual, by modelling with higher spatial density using dense data. Corrections that require such a denser metrology sampling cannot be done frequently without adversely affecting throughput.

It is a problem that model parameters based on sparse ADI data typically do not accurately represent densely measured parameter values. This may result from crosstalk that occurs between model parameters and non-captured parts of the fingerprint. Furthermore, the model may be over-dimensioned for such a sparse data set. This introduces a problem that a non-captured fingerprint in run-to-run control is not fully captured by a per-field model. Another problem is erratic sparse-to-dense behavior for distributed sampling, where different wafers (and different lots) have different sampling so that superposing the layouts of many wafers effectively leads to a dense measurement result. There are large residuals between modeled sparse data and densely measured parameter values. This leads to a poor fingerprint description, leading to sub-optimal corrections per exposure.

It is further a problem that for alignment control, only small number of alignment marks can be measured (~40) during exposure without impacting throughput. High-order alignment control requires denser alignment layout and impacts throughput. A solution to this problem, as shown in FIG. 5 is to measure denser alignment marks in an offline tool (Takehisa Yahiro et. al., "Feed-forward alignment correction for advanced overlay process control using a stand-alone alignment station "Litho Booster"," Proc. SPIE 10585, Metrology, Inspection, and Process Control for Microlithography XXXII; incorporated herein by reference) and feed forward this high-order correction during exposure, where low-order corrections are still calculated during exposure.

For overlay control, dense overlay measurements can practically be performed only once in several lots (known as higher-order parameter update) to update the high-order correction. The high-order parameters used to determine the scanner control recipe do not change between higher-order parameter update measurements.

State of the art methods of alignment are based on measuring positions of dedicated alignment or overlay marks on the substrate with respect to a reference of a position measurement system, such as an alignment system (either in the lithographic apparatus or the standalone alignment station).

However the number of alignment marks and/or overlay marks (metrology marks) is typically limited as there is limited space available on a production reticle to harbor the metrology marks. Consequently the accuracy of (per field) control actions using the position measurements on the metrology marks is limited in case higher order distortions of the substrate dominate for example intra-field behavior of the alignment mark positions.

Additionally the positions of the metrology marks may be subject to sources of variation which should not be the subject of said per field control actions.

SUMMARY

It is an object of the invention to overcome the problems associated with methods of alignment according to the state of the art.

In a first aspect of the invention, there is provided a method of determining a position of a product feature on a substrate, comprising: obtaining a plurality of position measurements of one or more product features on a substrate, wherein the measurements are referenced to either a positioning system used in displacing the substrate in between measurements or a plane parallel to the surface of the substrate; and determining a distortion component of the substrate based on the position measurements.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
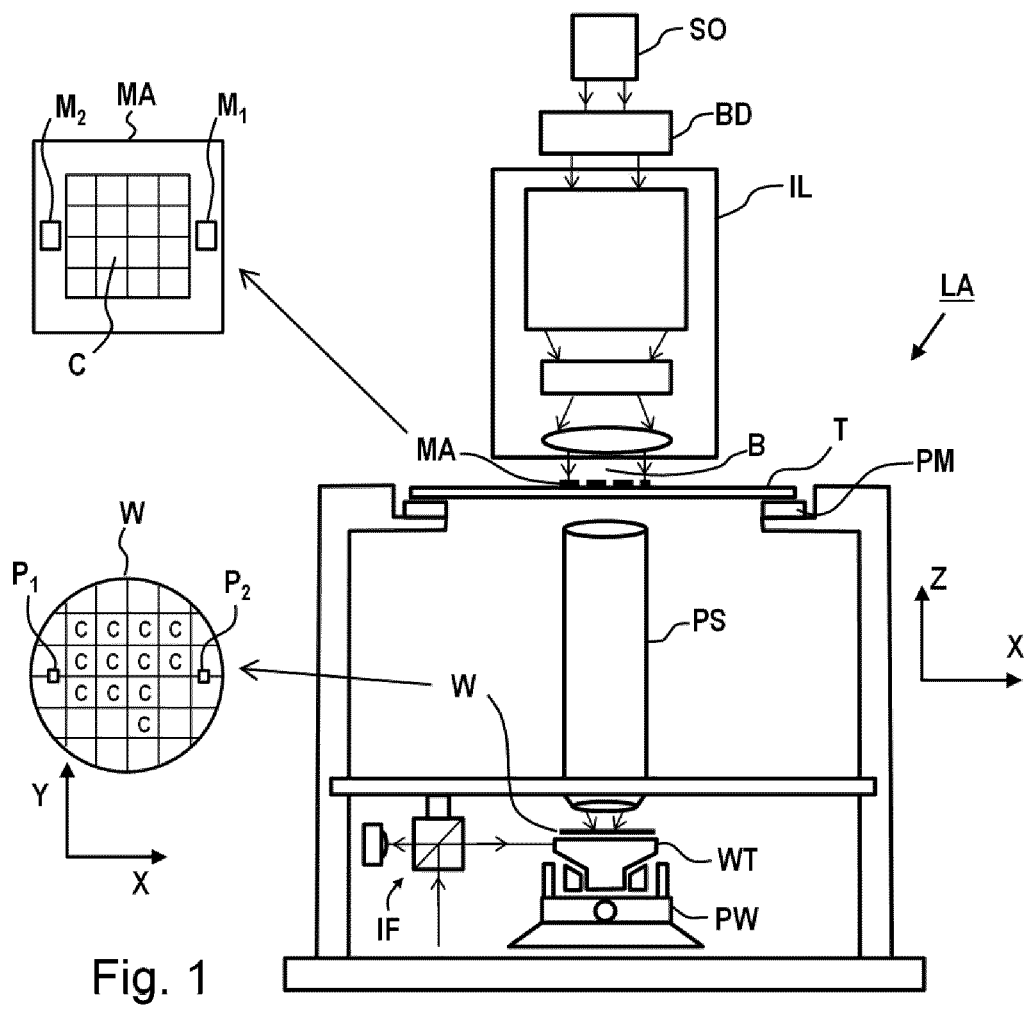
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein part of the substrate W, typically a rectangular region on the substrate called "field" or "exposure field", is exposed by the radiation beam B through the projection system PS while the substrate W is moved along a horizontal direction with respect to the radiation beam B. During the exposure of the substrate while moving the substrate W, the patterning device MA is also moved in the opposite direction to the substrate movement direction with respect to the illumination light. The field on the substrate W being exposed is exposed from one side of the filed to the other side of the field along the substrate movement direction by scanning the field by the radiation beam B by moving the substrate W with respect to the radiation beam B. The pattern in the patterning device MA is also scanned from one side of the pattern to the other side along the patterning device movement direction by the illumination light by the movement of the patterning device MA during the exposure. The part of the pattern imparted in the radiation beam B changes during the scanning of the pattern with the illumination light. The field is exposed from the one side of the field to the other side while the part of the pattern imparted in the radiation beam B changes from a part of the pattern on the one side of the pattern to a part of the pattern on the other side. The whole pattern in the patterning device MA is transferred to the field by scanning the field and the pattern from one side to the other side. The radiation beam B irradiated on the field of the substrate W is called "slit area" or "exposure slit area". Therefore, in this type of the lithographic apparatus LA, the slit area scans over each field of the substrate W to transfer the pattern.

During the scanning of the field, the substrate W and the patterning device MA are moved by the second positioner PW and the first positioner PM, respectively. These movement of the substrate W and the patterning device MA by the positioners are controlled in sync so that, when the slit area on the field is at a location in the field, the corresponding part of the pattern to be transferred onto the location in the field is imparted in the radiation beam B. For example, the pattern in the patterning device MA is the same size as the field on the substrate W, the patterning device MA and the substrate W are controlled to move in the same speed in the opposition directions to each other. When the pattern in the patterning device MA is X times larger than the filed size in the substrate W, then the movement of the patterning device MA is controlled X times faster than the movement of the substrate W. When the motion control of the substrate W and the patterning device MA is not in sync, the pattern to be transferred to the field is distorted by the deviation from the synchronized motion control. The pattern to be transferred to a field may also be distorted by other causes, e.g. relative rotation between the substrate W and the patterning device MA during the movement. For example, when the patterning device is scanned by the illumination light slightly off the scanning direction, the part of the pattern to be imparted in the radiation beam B is rotated. Then the part of the pattern to be transferred to the corresponding location in the field is also rotated. The opposite is also hold when the substrate W is scanned by the radiation beam B slightly off the scanning direction. Therefore, relative rotation of the patterning device MA and the substrate W during the scanning of a field also affects the distortion of the pattern to be transferred to the field. These factors such as the relative velocity between the substrate W and the patterning device MA, and the relative rotation between the substrate W and the patterning device MA during the scanning affects the accuracy of the pattern transfer. These scanning factors influencing the pattern transfer accuracy are called scan profile.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
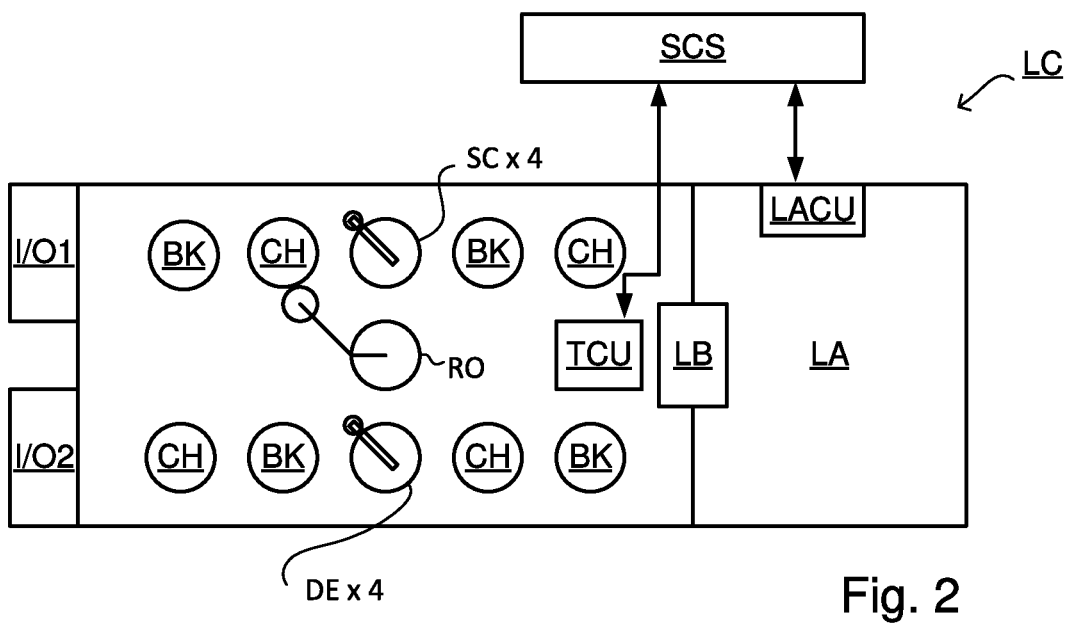
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
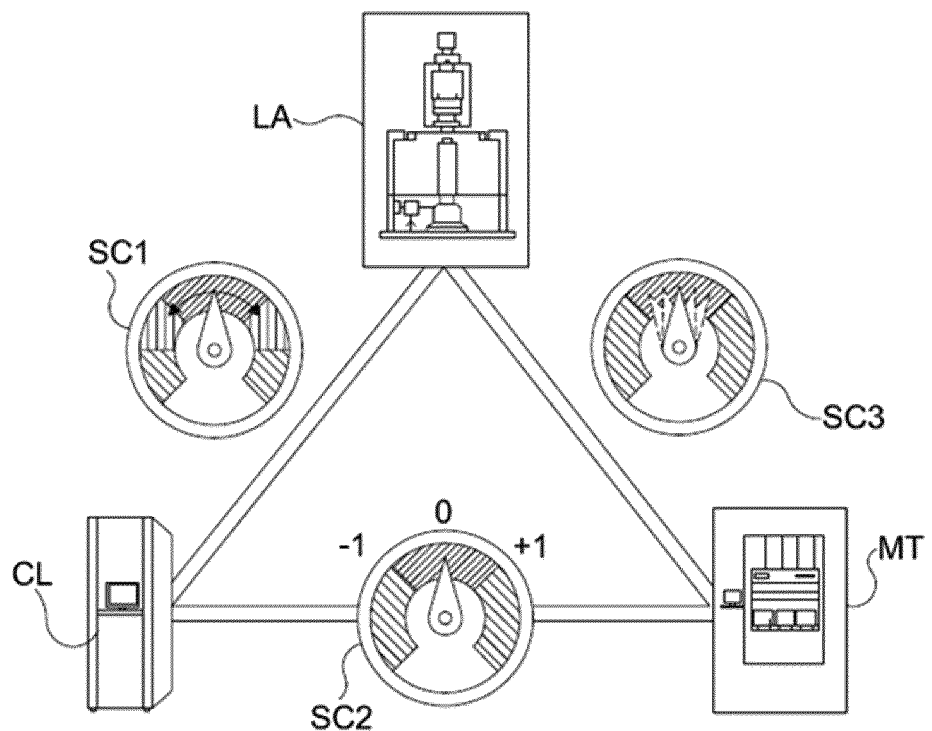
FIG. 3 depicts a schematic representation of holistic lithography, representing a cooperation between three key technologies to optimize semiconductor manufacturing.

Typically, the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

Substrate alignment methodology is typically performed by measuring dedicated metrology marks on the substrate. These marks comprise mark features having μm size pitches in order to be detectable by the alignment sensor. The mark features may be further segmented such that the marks behave optically in a similar manner as the device structures (product features).

However, even segmented marks respond differently to lens aberrations and process artefacts compared to the actual product features. Therefore the measured alignment mark positions will not represent the actual positions of the product features, while the actual positions of the product features are critical parameters for the process correction of the semiconductor manufacturing processes.

In an embodiment, alignment measurements are directly performed on device structures, e.g., on one or more product features, using at resolution metrology, for example using scanning electron microscope (SEM) or e-beam metrology. E-beam metrology tools may capture images comprising individual product features and determine the individual positions of the product features by machine vision technologies, e.g. pattern recognition. In another example the at resolution metrology system is based on optical position measurement of product features by using a high NA detection system and/or a detection system based on illumination of the product features at a small wavelength (XUV, EUV, DUV), or Atomic Force Microscope (AFM) or Scanning Tunneling Microscope (STM).

The at resolution metrology (alignment) system obtains the positions of the product features with respect to a reference point or a reference grid of the substrate itself or of the substrate holder (e.g., Wafer Table WT). Typically this is achieved by referencing the Field-Of-View (FOV) of the at resolution metrology system to the co-ordinate system of a substrate positioning system. The substrate positioning system may be operational within a stand-alone alignment system comprising the at resolution metrology system, or within a lithographic apparatus comprising the at resolution metrology system. By referencing the FOV as described, the obtained positions of the product features may be used in reconstructing a deformation (distortion) map of the substrate. The determined distortion map may subsequently be used in controlling processing steps, such as lithographic exposure steps. As potentially the position measurement may be performed on a large number of product features comprised within an (exposure) field or sub-field (for example a die area within a field), the distortion map may be determined accurately and at a very small spatial scale; e.g. fetching high order distortion components allowing high order intra-field or intra-sub-field control. Hence instead of relying on dense post-exposure data, such as overlay measured by a scatterometer, a control component (a lens or stage actuator of the lithographic apparatus) may already be configured for high order control based on data directly obtained during the alignment phase (e.g. data corresponds to the same substrate for which the control is targeted to).

So far it has been assumed that the FOV of the at resolution metrology system is referenced to the substrate positioning system. This is preferred as typically inspection of the product features requires the position of the substrate to be in accordance with a desired portion of the substrate (comprising the product features that are to be inspected) to be brought into the (fixed) FOV of the at resolution metrology system. Hence translations of the substrate need to be applied to the substrate during a measurement sequence. This typically requires accurate referencing of the FOV to the co-ordinate system of the translation (substrate positioning) system.

Alternatively the FOV of the at resolution metrology system is brought in line with a desired sampling position on the substrate; for example in case the at resolution metrology system is e-beam based, the inspection beam may be directed in correspondence to a desired sampling position on the wafer. In this case the (variable) FOV position needs to be referenced to the co-ordinate system of the substrate (plane).

In addition the product feature based position measurements typically represent the true device structure placement (errors), hence being better suited to be used in deriving substrate position and/or projection lens corrections configured to at least partially compensate deviations from nominal of the measured product feature positions.

To reference the FOV of the at metrology alignment system to the substrate positioning system or the substrate (plane) co-ordinate system a separate coarse substrate alignment step using conventional target like structures, e.g. target marks, may be performed in addition to the measurements on the product features using the at resolution alignment system. The separate coarse substrate alignment step may be based on the measurements of conventional alignment marks.

In an embodiment, a device may comprise a plurality of different kinds of product features which are overlay critical. Alignment measurements may be performed on each feature type independently. This allows for optimization of over-all device performance, based on the measurements of these product features.

The alignment metrology of this invention may be performed either inline (e.g. an alignment tool arranged inside a lithographic apparatus) or offline (e.g. an alignment tool arranged outside a lithographic apparatus). The benefit of inline measurement is that the alignment measurement is performed while being clamped on the substrate table of the lithographic apparatus so that the substrate is exposed by the lithographic apparatus while the substrate is held by the same substrate holder as being used during the alignment measurements. Therefore, the substrate deformation (distortion) as measured during inline alignment metrology is expected to be (nearly) identical to the actual deformation of the substrate during the lithographic exposure. The drawbacks of inline at resolution alignment are possible throughput impact and/or possible resist degradation.

The benefit of offline at resolution alignment measurement is that more alignment marks and product feature positions may be measured without reducing the throughput of the lithographic exposure process, allowing higher order alignment modeling and correction. Another benefit of the offline measurement is that the exposure resist is not degraded. The drawback of the offline measurement is that the offline alignment measurement is performed on a substrate held by a substrate holder that is different from the substrate table of the lithographic apparatus that subsequently exposes the substrate. Therefore, extra care has to be taken to correct for the substrate deformation impact due to clamping differences between the lithographic apparatus and the alignment metrology tool.

To account for differences between clamping induced substrate deformations in case of offline at resolution metrology alignment measurement it is advised that anchoring measurements may be performed. The anchoring measurements may comprise:
1) Sparse offline measurements on product features and/or alignment marks on a substrate using the at resolution metrology tool arranged outside of the lithographic apparatus. The sparse offline measurements may also be a subset of dense offline measurements.
2) Sparse inline measurements on the same product features and/or alignment marks on the substrate are performed using the alignment system inside the lithographic apparatus.

The clamping fingerprints corresponding to the offline measurements and the inline measurements are compared and used to determine a delta fingerprint representing a difference in substrate deformation due to the use of different substrate holders. The delta fingerprint may then be used to correct the offline determined substrate distortion such that the corrected substrate deformation is more representative for the substrate deformation occurring during the lithographic exposure. In addition, dense offline measurements on product features are performed. The dense offline measurements may then be corrected using the sparse offline measurements.

Before initiating the lithographic exposure, the corrected substrate deformation information and the inline alignment measurements may be used in configuring the lithographic exposure step such that the substrate positioning system and projection lens of the lithographic apparatus optimally compensates the substrate distortion while exposing the substrate.

The above description relates to using a tool such as an SEM/e-beam metrology tool for performing alignment metrology (in addition to CD metrology). This will be expanded on further and extended to other pattern placement metrology such as overlay. Such pattern placement metrology may be measured across wafer on a sub-nm level.

The e-beam tool used may comprise one or more stages and a stage measuring system operable to be able to determine the position of the/each stage with an accuracy of well below 1 nm (e.g., under 0.5 nm or under 0.2 nm). The e-beam tool may also have a landing energy sufficiently high that it can measure through stack and/or resist Such a landing energy may be greater than 10 kEV or greater than 20 kEV; for example, in a range between 10 kEV and 50 kEV.

With regard to alignment, a metrology image (e.g., e-beam or SEM image) may be aligned to a reticle reference file or .gds file, which describes the layout information or expected position of each reticle feature. Depending on the field of view of the metrology tool, it may be possible to align between 1000 and 10000 features to the reticle reference file. This can be expected to provide alignment results (reproducibility or measurement uncertainty) at well below 1 nm level (say 0.1 nm).

The position of the metrology image on the wafer may also be measured on a sub-nm level: As such, the stage position may be determinable with an accuracy at approximately the same level as the scanner stage. For example, the metrology tool may be provided with an interferometry system for stage position measurements to provide sufficient repro and relative accuracy of stage position measurements.

When stage position is known on sub-nm level it is possible to measure the position of both alignment marks and (directly) any device on the wafer. This enables measurement of the relative position or offset of devices with respect to the alignment marks. A sufficiently high landing energy enables measurements on both the alignment marks and the bottom grating of any devices of interest.

Such an e-beam metrology tool may be provided as a stand-alone alignment metrology station to measure wafers prior to exposure. As e-beam metrology is slower than optical metrology, the scanner may still comprise an optical alignment tool, such that the e-beam tool only measures a subset or percentage of all the wafers being exposed, and the optical tool used to measure all the wafers.

In this manner, it is possible to measure aligned positions (e.g., in-die) of actual devices as densely as desired. As such, it is possible to capture scribe lane-to-die distortions (e.g., local etch effects, impact of topology, intra-die stress).

It is possible to use the optical scanner alignment sensor to perform global wafer alignment (e.g. according to a 6 or 10 parameter model or higher order model) and compare the results of this scanner alignment data against the aligned positions as measured earlier on the same marks using the e-beam tool. In this way, it is possible to correct for chucking (wafer load grid) differences of the stand-alone e-beam tool and the scanner.

Figure 4:
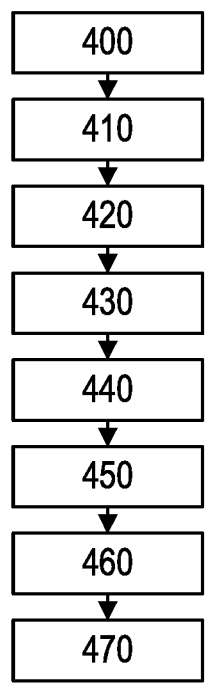
FIG. 4 is a flowchart describing an alignment method according to an embodiment.

FIG. 4 is a flowchart describing an alignment metrology method according to an embodiment.

At step 400, a first tool or an e-beam tool (e.g., a stand-alone e-beam alignment station) may be used to measure first tool target alignment data comprising the position of alignment marks on a wafer. Assuming that the e-beam tool has sufficient landing energy, the alignment marks may be buried alignment marks; e.g., the layer being aligned to is measured regardless of depth within the stack. Additionally the wafer may be coated in resist.

At step 410, the e-beam tool may be used to measure first tool device alignment data comprising the position of device structures in the same layer as the alignment marks measured in step 400. In contrast to optical alignment metrology, the device structures do not need to be periodic to be measured by the e-beam tool.

At step 420, the first tool target alignment data is referenced to a reference grid and at step 430, the first tool device alignment data is referenced to the reference grid.

At step 440, both the referenced first tool target alignment data and first tool device alignment data may be used to construct alignment-to-device offsets for some or all devices measured. Such an offset may comprise the difference in measured positions per device in the first tool device alignment data compared to the measured positions in the first tool target alignment data. The device measurements may be averaged over multiple occurrences of each device per die to average out actual within-die distortions.

At step 450, the offsets determined in step 440 may be combined into a dense grid of alignment offsets with respect to each alignment mark, e.g., across one or more of: die, field and wafer.

At step 460, the scanner alignment tool or optical alignment tool (second metrology tool) is used to measure the alignment marks on the wafer to obtain second tool target alignment data. The first tool target alignment data and second tool target alignment data may be compared to determine a difference or delta grid between these two datasets. This delta grid is largely due to differences which occur because a different stage is used for alignment on the stand-alone alignment station than used for alignment within the scanner (i.e., chucking differences or delta wafer load grid).

At step 470, dense alignment correction grid is determined from the dense grid of alignment offsets (e.g., per device) obtained at step 450, corrected for the chucking differences determined at step 460.

The dense grid corrections may be applied as a feedforward correction to the scanner (e.g., on the alignment grid). As such, the dense alignment grid may be used to correct alignment for all wafers for which the alignment data is obtained using only the optical metrology tool (e.g., within the scanner. This may be the majority of wafers, with only a minority actually measured using the e-beam metrology tool. The e-beam metrology tool may be used only periodically, e.g., for only a first wafer of a lot. In this way, optical alignment measurements performed in the scanner on the alignment marks can be corrected to (at least nearer) what would be measured by an e-beam tool directly on a specific feature.

The same basic principle can be applied to correction of overlay metrology, which suffers from the same issues as alignment metrology, in particular that overlay metrology is typically measured on targets which need to be sufficiently large and have a periodic pattern of sufficiently large pitch to be measured optically. This means that the targets are not necessarily truly representative of the device structure, resulting in what is termed a metrology-to-device offset (difference between measured overlay on a target and the actual overlay of a product structure). Target-based optical overlay metrology may comprise micro-diffraction based overlay metrology (μDBO). In μDBO, overlay is determined from the intensity difference of corresponding or complementary higher diffraction orders (for example the +1 and −1 diffraction orders). These diffraction orders may be imaged in an image plane (e.g., a dark-field image where the zeroth order is blocked before the image plane), and the intensities averaged over a region of interest (ROI) within each image of a diffraction order. It is also known to perform optical overlay metrology directly on product structure or targets which mimic the product structure, which is often termed in-device metrology (IDM). IDM may be based on detection of an angularly resolved spectrum scattered from the device structure in a pupil plane. However, IDM requires a periodic structure, so not all device structure can be measured in this way. Another optical overlay metrology technique to which the concepts disclosed herein are applicable, is image based overlay (IBO). IBO metrology may comprise determining relative offsets between two or more layers on a sample based on relative imaged positions of features of an overlay target in the different layers of interest. Such a method may use dedicated targets such as box-in-box targets wherein overlay is determined from the position of a first box imaged in one layer with respect to a second box imaged in another layer, with one box being smaller and located inside the other. Other IBO methods and target types exist for which the concepts herein are equally applicable.

Figure 5:
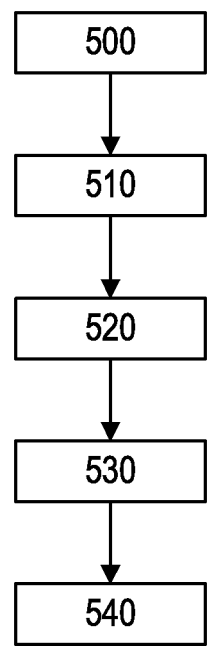
FIG. 5 is a flowchart describing a feed-forward overlay method according to an embodiment.

FIG. 5 is a flowchart describing a method for performing overlay feedforward corrections according to an embodiment. At step 500, the overlay fingerprint of the previous layer may be measured (e.g., after-etch) using an optical metrology tool (a second metrology tool) to measure overlay targets per wafer. Such measurements may be IBO, DBO, μDBO or IDM target-based measurements for example, to obtain second tool target overlay data. This may comprise a high throughput measurement on every wafer to enable a wafer level feedforward correction to be determined for the wafer. As this step may be performed for each wafer, this step may comprise a sparse measurement (e.g., one or two targets per field).

At step 510, e-beam metrology is performed on the same overlay targets (e.g., after etch inspection AEI targets) to obtain first tool target overlay data (effectively the difference of positional measurements for each the two constituent gratings or components of the overlay target). This may be performed on a subset of wafers (e.g., one per lot). In a similar manner to the previous embodiment, the second tool target overlay data and first tool target overlay data may be compared to determine a difference or delta grid between these two datasets, where the delta grid is largely due to stage differences (chucking differences) between the tools used.

At step 520, the e-beam tool may be used to measure overlay on device structures (which may be non-regular/periodic) to obtain first tool device overlay data. Once again this may comprise effectively a positional measurement of the device structure with respect to a previous layer or structure therein. This step may be performed on the same subset of wafers as step 510.

At step 530, a dense in-die overlay grid may be determined from the first tool target overlay data and first tool device overlay data. This dense in-die overlay grid may describe in-die distortion with respect to the overlay target measurements (e.g., a dense grid describing the MTD offset).

At step 540, using the second tool target overlay data, first tool target overlay data and first tool device overlay data, a wafer-level feedforward correction may be determined for an exposure within the scanner, the exposure to be performed on each of the wafers measured to obtain the second tool target overlay data. This may comprise an optimization for edge placement error (EPE) or overlay based on the dense in-die overlay grid. The correction may be based on measurement offsets (MTD offsets) between the first tool device overlay data with respect to the second tool target overlay data (e.g., the dense in-die overlay grid), corrected for the chucking differences. For example, the optimization may be a weighted optimization over the determined multiple MTD offsets (e.g., per device type and/or wafer area) based on (EPE) criticality (process window) of the various devices, using the first target metrology data as an input. Such a multi-feature overlay optimization may be comparable to CD die optimization as presently used for dose control.

It can be appreciated that the embodiments of FIG. 4 and FIG. 5 may be combined, such that feedforward exposure corrections may be obtained based on both alignment data according to the embodiment of FIG. 4 and overlay data according to the embodiment of FIG. 5. For example, both of the alignment data and overlay data may be used to determine dense control grid corrections for the exposure.

Figure 6:
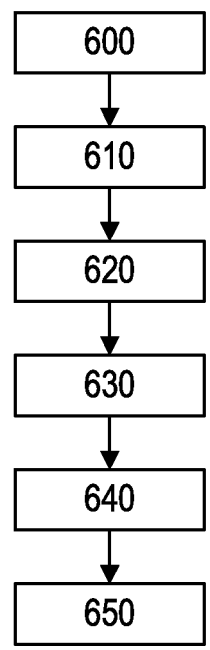
FIG. 6 is a flowchart describing a feedback overlay method according to an embodiment.

In another embodiment, an e-beam measurement assisted overlay feedback control is also disclosed. FIG. 6 is a flowchart describing such an embodiment.

At step 600, a first overlay fingerprint may be measured after-etch using an optical metrology tool to measure overlay targets per wafer. Such measurements may be IDM target-based measurements for example, to obtain second tool after-etch overlay data or second tool AEI overlay fingerprint (e.g., an IDM overlay fingerprint). This step may be performed for every wafer.

At step 610, a second overlay fingerprint may be measured after-develop using an optical metrology tool to measure overlay targets per wafer. Such measurements may be IBO, DBO or μDBO target-based measurements for example, to obtain second tool after-develop overlay data or second tool ADI overlay fingerprint. (e.g., an IBO or DBO overlay fingerprint). This step may be performed for every wafer.

At step 620, ADI e-beam metrology may be performed e.g., on a subset of the wafers measured at step 610, to obtain first tool after-develop overlay data. This first tool ADI overlay data may comprise metrology data from IBO or DBO targets measured ADI, from IDM targets measured ADI and on device structures ADI (e.g., at least critical devices).

At step 630, AEI e-beam metrology may be performed e.g., on a subset of the wafers measured at step 600, to obtain first tool after-etch overlay data. This first tool AEI overlay data may comprise metrology data from IDM targets measured AEI and on device structures AEI (e.g., at least critical devices). Step 630 may be an alternative or additional to step 620.

At step 640, the first and second tool ADI overlay data and/or first and second tool AEI overlay data is used to determine (as appropriate):
ADI MTD offset(s) per device (e.g., device-to-DBO) from a comparison of the target measurements and the device measurements obtained at step 620, to obtain a DBO measurement grid;
AEI MTD offset(s) per device (e.g., device-to-IDM) from a comparison of the target measurements and the device measurements obtained at step 630 to obtain a IDM measurement grid;
Process offset per device (e.g., the difference of the device measurements performed ADI at step 620 and AEI at step 630) to obtain a dense grid (also within die), per device.

At step 650, using all datasets determined in the previous embodiment, feedback correction can be determined. This may be done based on a multi-feature overlay optimization comparable to CD die optimization as used for dose, including weights based on overlay margin/device (EPE criticality). The step may also comprise using process offsets per device and MTD per device to enable control of actual on-device overlay. As before, the second tool overlay data may be used with one or both of the first tool after-develop overlay data and first tool after-etch overlay data to determine corrections for stage differences or chucking differences between the tools used.

It can be appreciated that the embodiments of FIG. 6 may be combined with one or both of the embodiments of FIG. 4 and FIG. 5.

The images captured by the e-beam tool can of course still be used for CD/local CDU measurements. This gives CD measurement data describing on device CD (e.g., for multiple devices) which can be used for feedback scanner (dose) corrections for same layer exposures of a subsequent lot or can be used in combination with registration error data for determining a feedforward correction for a next layer exposure of the wafers measured (e.g., for dose/overlay).

Ultimately, an e-beam tool may be used in-line (e.g., in place of or alongside an optical alignment sensor such as labeled AS in FIG. 1) to perform alignment measurements directly on device structures. In this way, alignment may be made more densely on any structure without the need to accommodate more (or any) alignment marks. As alignment measurements are performed directly on the device structure, the problem of metrology to device offsets (targets behaving differently to device structures) is obviated.

Offline at resolution alignment measurement enables more alignment marks and product feature positions to be measured and opens up the possibility of using improved (e.g., higher order) alignment models than is feasible with present inline measurement strategies. There is typically not enough metrology time available for the inline measurement strategies to measure the amount of marks required to perform more desirable modeling strategies. For example, the following alignment granularities are typically used at present:
Interfield: global wafer placement and deformation. This is presently done using linear models (e.g., 6 parameter models), or "higher order" models (typically up to the fifth order);
Intrafield: to align the average field fingerprint;
Zone alignment: an interpolation/extrapolation method which may be used to capture more local deformations.

The disadvantage of the existing alignment granularities is that a very high order fingerprint, such as caused for example by the scanner exposure, cannot properly be compensated. The result is that these fingerprints require correction by other means such as overlay control based on a feedback control loop. Such feedback control loops, by their nature, are always "catching up" as the fingerprints tend to change over time and therefore suffer from the delay of the correction. They also tend to suffer from wafer-to-wafer variation and lot-to-lot noise.

It is therefore proposed, for the offline measurement embodiments disclosed here, to measure a much denser alignment layout (which may include product structures and/or dedicated targets) than is presently used (e.g., for inline alignment metrology), thereby allowing higher order alignment modeling.

Such a proposal may comprise performing alignment on any or a combination (where applicable) of the following granularities and alignment modeling strategies:

- Per field (exposure) modeling: when there are sufficient targets within each field, then a per field modeling can be performed;
  - Every field may be individually modeled; alternatively the per-field modeling may be performed on only a subset of fields. For example, a first subset of fields in a first substrate region (e.g., in an inner substrate region) may be modeled using a first strategy such as an average field fingerprint strategy, and a second subset of fields in a second substrate region (e.g., in an outer substrate region where greater variation may be expected) may be modeled using a second strategy such as said per field modeling strategy. Of course, the decisions as to where and how frequently per field modeling is performed may depend on the overlay behavior/requirements.
- Average sub-field modeling: This may be performed, for example, where little variation over sub-fields is observed.
- Per sub-field modeling where some or all sub-fields are modeled separately.
  - This can be very costly in terms of metrology effort and as such may be done only when there is strong variation over sub-fields, and possible only for a small subset of the fields on the wafer (e.g., at the extreme edge);
- Per die: essentially a special case of per-sub-field, but with even higher granularity than a sub-field comprising several dies.
- Modelling of a distortion fingerprint across an area associated with an extension of the radiation beam B across a substrate (e.g, so-called slit area), e.g. the slit fingerprint:
  - The slit fingerprint is often characterized to a large extent by a contribution of the projection optics (e.g. the lens) to a distortion fingerprint of the lithographic apparatus. The lens contribution (lens fingerprint) typically contains high order components and thus requires dense distortion (alignment) measurements in case it needs to be determined. The method of on-product alignment as described above allows determination of the slit fingerprint as it only relies on the presence of product features without the need to provide many alignment marks on a small area on the reticle corresponding to the slit area. The slit fingerprint may also comprise reticle errors.
  - The slit fingerprint represents the distortion components of the substrate over the exposure slit area, e.g. the distortion plotted with respect to the distance from the center of the exposure slit area in the non-scanning direction. The distortion with respect to the distance from the center of the slit in the non-scanning direction may be calculated by averaging measurements of the product features of the same distance from the center of the slit in the non-scanning direction.
  - The high order slit fingerprint may then be identified using the measurements of the product features on the substrate. This enables to identify, for example, the lens fingerprint of the lithographic apparatus used for exposing the previous layer of the substrate. The identified lens fingerprint may then be used to control the projection lens to compensate for the lens fingerprint in the subsequent layers and/or subsequent substrates to be exposed using the lithographic apparatus.
- Modelling of a distortion fingerprint in a field along the scanning direction e.g. the scan profile fingerprint:
  - The scan profile fingerprint is a distortion of the transferred patterns in a field along the scanning direction due to the scan profile of the lithographic apparatus used for the exposure. The scan profile is often characterized to a large extent by a contribution of the relative velocity variation between the positioning device of the patterning device and the positioning device of the substrate during the scanning. The scan profile is also characterized by a contribution of the relative rotation variation between the positioning device of the patterning device and the positioning device of the substrate during the scanning. The scan profile fingerprint also contains high order components and thus requires dense distortion (alignment) measurements in case it needs to be determined. The method of on-product alignment as described above allows determination of the scan profile fingerprint as it only relies on the presence of product features without the need to provide many alignment marks in the pattern on the reticle.
  - The scan profile fingerprint represents the distortion components of the substrate in the scanning direction of the field, e.g. the distortion plotted with respect to the scanning direction position in the field coordinate. The scan profile distortion may be calculated by averaging measurements of the same field coordinate position in the scanning direction.
  - The above described method of on-product alignment is advantageous for determining the scan profile fingerprint for the same reasons as the slit fingerprint that the dense measurements required to determine the high order distortion may be performed using the product features without introducing many alignment marks.
  - The scan profile fingerprint may be performed on an average field such as an average scan-up field or scan-down field. The scan profile may also be performed on a single field (per exposure field basis).
  - The high order scan profile fingerprint may then be identified using the measurements of the product features on the substrate. This enables to identify the distortion of the transferred pattern on the substrate due to the scan profile such as the relative velocity variation and/or relative rotation variation between the positioning device of the substrate stage and the positioning device of the patterning device. The identified scan profile fingerprint may then be used to calibrate and/or control the positioning devices of the substrate and the patterning device to compensate for the scan profile fingerprint in the subsequent layers and/or subsequent substrates to be exposed using the lithographic apparatus.

These strategies and granularities can also be combined with already existing alignment strategies/granularities if desired (and where applicable). In all of the above, the term sub-field may refer to any subset of dies, a single die or even to a partial die or a sub-field including partial dies.

In addition or alternatively to the above strategies, modeling may also be performed per product feature. For example, for edge placement optimization (e.g., optimization of individual feature placement) it is important to know the position of the different (e.g., critical) product features.

Critical features may be those for which particular care in placement is required (e.g. they have a narrow process window). Measuring and modeling per feature allows optimization of the edge placement. For example, different weights could be used for different features depending on their criticality (e.g. depending on the locations of the features within the layout and/or the types of the features).

Potentially, when the per field alignment fingerprint is stable within a particular group or set (e.g., over a lot, for a chuck or over another group of wafers) then the high granularity alignment (e.g., sub-field metrology) could be performed on only a single wafer (e.g., the first wafer) or other subset per group. The result of this alignment may then be used (at least in part) for the other wafers in the group. As such these following wafers only require sparse measurement, which can then be supplemented by the dense modeling performed on the single wafer. In such an embodiment, possibly only the densely measured wafer of the group is measured offline, with the remaining sparsely measured wafers measured inline. These latter wafers may even be measured more sparsely than for present strategies (or at least present higher order alignment strategies) thus improving overall throughput.

Another option, when measuring offline, is to perform distributed sampling over wafers. This will allow high order modeling per lot/chuck/group of wafers, while performing lower order modeling per wafer. This is not possible inline, because all measurement data are needed before the modeling can be performed. Distributed sampling can also (alternatively or additionally) include distribution over a subset of fields within a wafer; e.g., per-field modeling may be performed on only a subset of fields. This latter form of distributed sampling is possible with in-line alignment measurement also.

Although offline alignment measurements on-device will offer scanner availability benefits, it is not a requirement for the invention. Either offline or inline measurements, on mark or on-device, will be possible.

Further embodiments may be described in the following clauses:

1. A method of determining a distortion component of a substrate, comprising:
   obtaining a plurality of position measurements of one or more product features on a substrate, wherein the measurements are referenced to either a positioning system used in displacing the substrate or a plane parallel to the surface of the substrate; and determining a distortion component of the substrate based on the plurality of position measurements.
2. Method according to clause 1, wherein the distortion component is associated with an in-plane distortion of the substrate and/or positions of product features on the substrate.
3. Method according to clause 2, further comprising:
   obtaining a measurement of one or more alignment marks on the substrate; and determining the positions of the product features based on the measurements of the product features and/or the image of the product features, and the measurement of the one or more alignment marks.
4. Method according to any of clauses 1 to 3, wherein at least part of the measurements of the product features and/or the image of the product feature is performed inline using an alignment tool arranged in a lithographic apparatus.
5. Method according to any of clauses 1 to 4, wherein at least part of the measurements of the product features and/or the image of the product features is performed offline using an alignment tool arranged outside of or connected to a lithographic apparatus.
6. Method according to any of clauses 3 to 5, wherein at least part of the measurements of the product features and/or the image of the product features is performed offline, and at least part of the measurement of the one or more alignment marks is performed inline.
7. Method according to clause 6, wherein the offline measurement and the inline measurement are combined by coupling deformation grids of alignment tools used for the offline measurement and the inline measurement.
8. Method according to clause 1 or 2, wherein the plurality of position measurements comprise first tool metrology data measured using a first metrology tool, or comprise the first tool metrology data measured using the first metrology tool and second tool metrology data measured using a second metrology tool.
9. Method according to clause 8, wherein the first metrology tool is a scanning electron microscope tool and/or the second metrology tool is an optical metrology tool.
10. Method according to clause 9, wherein the scanning electron microscope measures at least one of the plurality of position measurements of one or more product features and/or a target on the substrate under the top layer of the substrate.
11. Method according to clause 10, wherein the at least one of the plurality of the position measurements of one or more product features and the target on a same layer.
12. Method according to any of clause 9 to 11, wherein an electron beam of the scanning electron microscope has a landing energy greater than 10 keV.
13. Method according to any of clause 9 to 12, wherein the electron beam of the scanning electron microscope has a landing energy below 50 keV.
14. Method according to any of clauses 8 to 13, wherein the first tool metrology data comprises first tool target metrology data measured on targets and first tool device metrology data measured on device structures.
15. Method according to clause 14, comprising determining, from the first tool target metrology data and first tool device metrology data, one or more metrology-to-device offsets for one or more device structures related to said first tool device metrology data; wherein said one or more metrology-to-device offsets comprises a comparison in the measured value per device in the first tool device metrology data with respect to the corresponding measured value in the first tool target metrology data.
16. Method according to clause 15, comprising combining said one or more metrology-to-device offsets into a dense grid of metrology offsets with respect to each target.
17. Method according to clause 15 or 16, comprising applying the dense grid of metrology offsets and/or said one or more metrology-to-device offsets as a feedforward correction to a reference grid of an exposure apparatus.
18. Method according to clause 15 or 16, comprising applying the dense grid of metrology offsets and/or said one or more metrology-to-device offsets as a feedback correction to a reference grid of an exposure apparatus.
19. Method according to clause 17 or 18, comprising determining a stage correction and/or an exposure correction from a comparison of the first tool target metrology data and second tool target metrology data; and applying the stage correction and/or the exposure correction to said feedforward correction or feedback correction.

20. Method according to any of clauses 14 to 19, wherein the first tool target metrology data comprises first tool target alignment data measured on alignment marks and the first tool device metrology data comprises first tool device alignment data measured on device structures.

21. Method according to clause 20, wherein the second tool metrology data comprises second tool target data measured on said alignment marks.

22. Method according to clause 20 or 21, wherein said second metrology tool comprises an optical alignment sensor.

23. Method according to any of clauses 14 to 19, wherein the first tool target metrology data comprises first tool target overlay data measured on overlay targets and the first tool device metrology data comprises first tool device overlay data measured on device structures.

24. Method according to clause 23, wherein the first tool target overlay data comprises one or both of first tool after-etch target overlay data, obtained after an etch step is performed on said target and first tool after-develop target overlay data obtained before an etch step is performed on said target, and the first tool device metrology data comprises one or both of first tool after-etch device overlay data, obtained after an etch step is performed on said device structure and first tool after-develop device overlay data obtained before an etch step is performed on said device structure.

25. Method according to clause 24, comprising an additional step of determining an offset between the first tool after-etch device overlay data and the first tool after-develop device overlay data.

26. Method according to any of clauses 23 to 25, wherein the second tool metrology data comprises second tool target data measured on said overlay targets.

27. Method according to any of clauses 23 to 26, wherein said second metrology tool comprises an optical scatterometer metrology tool.

28. Method according to any of any preceding clause, further comprising modeling of the distortion component of the substrate for at least one exposure field or sub-field on said substrate according to a first field or sub-field model.

29. Method according to clause 28, wherein said modeling according to the first field or sub-field model is performed on a first average field or sub-field of a first subset of fields or sub-fields on said substrate.

30. Method according to clause 29, wherein the first subset of fields or sub-fields are in a first substrate region of said substrate and a second field or sub-field in a second substrate region of said substrate is modeled according to a second field or sub-field model.

31. Method according to clause 30, wherein said first region is an inner region of the substrate and said second region is an outer region of the substrate.

32. Method according to any of clauses 28 to 31, wherein said first field model or sub-field model comprises a die model or sub-die model which models one or more dies or sub-dies on said substrate.

33. Method according to any of clauses 28 to 32, wherein said first field or sub-field modeling is performed on a first subset of a group of substrates and the result of the first field or sub-field modeling is used for a second subset of the group of substrates.

34. Method according to any of clauses 28 to 33, further comprising modeling positions of one or more positions of different product features.

35. Method according to clause 34, wherein the different product features comprise product features of different types and/or product features located in different positions in fields of said substrate.

36. Method according to any of clauses 1 to 35, further comprising modeling of the distortion component of the substrate for at least one exposure field or sub-field on said substrate and/or an exposure slit of a lithographic apparatus used for manufacturing a previous layer of the substrate according to a slit fingerprint model.

37. Method according to clause 36, wherein the slit fingerprint model comprises a lens fingerprint model.

38. Method according to clause 36 or 37, wherein said modeling according to the slit fingerprint model is performed on a second average field of a second subset of fields or sub-fields of the substrate.

39. Method according to any of clauses 1 to 38, further comprising modeling of the distortion component of the substrate for at least one exposure field or sub-field on said substrate according to a scan profile fingerprint model.

40. Method according to clause 39, wherein said modeling according to the scan profile fingerprint model is performed on a third average field of a third subset of fields or sub-fields of the substrate.

41. Method according to clause 40, wherein the third subset of fields or sub-fields comprises scan-up fields or scan-down fields.

42. Method according to clause 39, wherein said modeling according to the scan profile fingerprint model is performed on a per exposure field.

43. Method according to any of clause 28 to 42, wherein at least part of the measurements of the product features and/or the image of the product features is performed offline using an alignment tool arranged outside of or connected to a lithographic apparatus.

44. Method according to any of clauses 1 to 43, wherein at least part of the plurality of position measurements are distributed over a plurality of substrates.

45. Method according to any of clause 2 to 44, further comprising determining an edge placement control of product features based on the positions of the product features.

46. Method according to clause 45, wherein further comprising setting weights to product features depending a criticality of the product features.

47. Method of exposing a substrate using a lithographic apparatus, comprising:

the step of determining the positions of the product features on the substrate according to any of clauses 2 to 44, and the step of exposing a substrate at least partly based on the determined positions of the product features.

48. Method according to any of clauses 2 to 47, wherein the step of obtaining the measurements of the product features or the image of the product features is performed using an electron beam apparatus.

49. An exposure apparatus comprising an electron beam apparatus configured, wherein the exposure apparatus is configured for performing the method according to any of clauses 1 to 48.

50. An exposure system comprising an exposure apparatus for exposing a substrate and an electron beam apparatus, wherein the electron beam apparatus is configured for performing the method according to any of clauses 1 to 48.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). It is also to be noted that the term metrology apparatus or metrology system encompasses or may be substituted with the term inspection apparatus or inspection system. A metrology or inspection apparatus as disclosed herein may be used to detect defects on or within a substrate and/or defects of structures on a substrate. In such an embodiment, a characteristic of the structure on the substrate may relate to defects in the structure, the absence of a specific part of the structure, or the presence of an unwanted structure on the substrate, for example.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of physical systems such as structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of a physical structure may relate to defects in the structure, the absence of a specific part of the structure, or the presence of an unwanted structure on the substrate or on the wafer.

Although specific reference may have been made above to the use of embodiments of the invention in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. With respect to the multi-sensitivity target embodiment, the different product features may comprise many regions with varying sensitivities (varying pitch etc.). Further, pitch p of the metrology targets is close to the resolution limit of the optical system of the scatterometer, but may be much larger than the dimension of typical product features made by lithographic process in the target portions C. In practice the lines and/or spaces of the overlay gratings within the target structures may be made to include smaller structures similar in dimension to the product features.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A method of determining a distortion component of a substrate, the method comprising:
   obtaining a plurality of position measurements of one or more product features on, or in, a surface of a substrate and of one or more alignment marks of the substrate, wherein the measurements of the one or more product features are referenced to either a positioning system used in displacing the substrate or a plane parallel to the surface of the substrate; and
   determining, by a hardware apparatus, a distortion component of the substrate based on the plurality of position measurements.

2. The method according to claim 1, wherein the distortion component is associated with an in-plane distortion of the substrate and/or positions of product features on the substrate.

3. The method according to claim 1, further comprising determining positions of the one or more product features based on the measurements of the one or more product features and/or an image of the one or more product features, and the measurement of the one or more alignment marks.

4. The method according to claim 3, wherein at least part of the measurements of the one or more product features and/or the image of the one or more product features is performed offline, and at least part of the measurement of the one or more alignment marks is performed inline.

5. The method according to claim 4, wherein the offline measurement and the inline measurement are combined by coupling deformation grids of alignment tools used for the offline measurement and the inline measurement.

6. The method according to claim 1, wherein the plurality of position measurements comprise first tool metrology data measured using a first metrology tool and second tool metrology data measured using a second metrology tool.

7. The method according to claim 6, wherein the first metrology tool is a scanning electron microscope tool and/or the second metrology tool is an optical metrology tool.

8. The method according to claim 6, wherein the first tool metrology data comprises first tool target metrology data measured on one or more targets and first tool device metrology data measured on one or more device structures.

9. The method according to claim 8, comprising determining, from the first tool target metrology data and first tool device metrology data, one or more metrology-to-device offsets for one or more device structures related to the first tool device metrology data, wherein the one or more metrology-to-device offsets comprises a comparison in the measured value per device structure in the first tool device metrology data with respect to the corresponding measured value in the first tool target metrology data.

10. The method according to claim 9, comprising combining the one or more metrology-to-device offsets into a dense grid of metrology offsets with respect to each target.

11. The method according to claim 9, further comprising applying the one or more metrology-to-device offsets as a feedforward correction or feedback correction to a reference grid of an exposure apparatus.

12. The method according to claim 8, wherein the first tool target metrology data comprises first tool target alignment data measured on one or more alignment marks and the first tool device metrology data comprises first tool device alignment data measured on one or more device structures.

13. The method according to claim 8, wherein the first tool target metrology data comprises first tool target overlay data measured on one or more overlay targets and the first tool device metrology data comprises first tool device overlay data measured on one or more device structures.

14. The method according to claim 1, further comprising modeling of the distortion component of the substrate for at least one exposure field or sub-field on the substrate according to a field model, a sub-field model, or a scan profile fingerprint model, and/or an exposure slit of a lithographic apparatus used for manufacturing a previous layer of the substrate according to a slit fingerprint model.

15. A non-transitory computer program product configured to cause a hardware apparatus to at least:
obtain a plurality of position measurements of one or more product features on, or in, a surface of a substrate and of one or more alignment marks of the substrate, wherein the measurements of the one or more product features are referenced to either a positioning system used in displacing the substrate or a plane parallel to the surface of the substrate; and
determine a distortion component of the substrate based on the plurality of position measurements.

16. The computer program product of claim 15, wherein the distortion component is associated with an in-plane distortion of the substrate and/or positions of product features on the substrate.

17. The computer program product of claim 15, wherein the plurality of position measurements comprise first tool metrology data measured using a first metrology tool and second tool metrology data measured using a second metrology tool.

18. The computer program product of claim 15, further configured to cause the hardware apparatus to:
obtain a measurement of one or more alignment marks on the substrate; and
determine positions of the one or more product features based on the measurements of the one or more product features and/or an image of the one or more product features, and the measurement of the one or more alignment marks.

19. The computer program product of claim 15, further configured to cause the hardware apparatus to model the distortion component of the substrate for at least one exposure field or sub-field on the substrate according to a first field, sub-field model or scan profile fingerprint model, and/or an exposure slit of a lithographic apparatus used for manufacturing a previous layer of the substrate according to a slit fingerprint model.

20. A non-transitory computer program product configured to cause a hardware apparatus to at least:
obtain a plurality of position measurements of one or more product features on, or in, a surface of a substrate taken by an apparatus that inspects or measures using an electron beam, wherein the measurements are referenced to either a positioning system used in displacing the substrate or a plane parallel to the surface of the substrate; and
determine a distortion component of the substrate based on the plurality of position measurements.

* * * * *